United States Patent
Kim et al.

(10) Patent No.: US 9,257,623 B2
(45) Date of Patent: Feb. 9, 2016

(54) LIGHT-EMITTING DIODE PACKAGE

(71) Applicant: SAMSUNG ELECTRONICS CO., LTD., Suwon-si, Gyeonggi-do (KR)

(72) Inventors: Jung-jin Kim, Hwaseong-si (KR); Min-young Son, Seoul (KR); Yong-min Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/574,094

(22) Filed: Dec. 17, 2014

(65) Prior Publication Data

US 2015/0236228 A1 Aug. 20, 2015

(30) Foreign Application Priority Data

Feb. 17, 2014 (KR) .................. 10-2014-0018032

(51) Int. Cl.

| | |
|---|---|
| *H01L 33/38* | (2010.01) |
| *H01L 33/56* | (2010.01) |
| *H01L 33/62* | (2010.01) |
| *H05B 33/08* | (2006.01) |
| *H04N 5/225* | (2006.01) |
| *H01L 33/44* | (2010.01) |
| *H01L 33/50* | (2010.01) |
| *H01L 33/00* | (2010.01) |

(52) U.S. Cl.
CPC ............... *H01L 33/62* (2013.01); *H01L 33/44* (2013.01); *H01L 33/50* (2013.01); *H01L 33/56* (2013.01); *H04N 5/2256* (2013.01); *H04N 5/2257* (2013.01); *H05B 33/0845* (2013.01); *H01L 33/0079* (2013.01); *H01L 33/382* (2013.01)

(58) Field of Classification Search
CPC .......... H01L 33/38; H01L 33/56; H01L 33/62
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |

(Continued)

OTHER PUBLICATIONS

Xuejun Fan, "Wafer Level system Packaging and Integration for Solid State Lighting (SSL)," 2012 13th International Conference on Thermal, Mechanical and Multi-Physics Simulation and Experiments in Microelectronics and Microsystems, EuroSimE 2012, pp. 1-6.

(Continued)

*Primary Examiner* — Marc Armand
(74) *Attorney, Agent, or Firm* — McDermott Will & Emery LLP

(57) ABSTRACT

A light-emitting diode package includes a light-emitting structure, a first electrode pad and a second electrode pad connected with the light-emitting structure, an insulating pattern layer in contact with a bottom surface of the light-emitting structure and abutting the first and second electrode pads, a substrate including via-holes in contact with a bottom surface of the insulating pattern layer and exposing a portion of the first electrode pad and a portion of the second electrode pad, a first penetrating electrode and a second penetrating electrode that are disposed in the via-holes and respectively connected with the first and second electrode pads, a fluorescent material layer disposed on the light-emitting structure, a glass disposed on and spaced apart from the light-emitting structure with the fluorescent material layer therebetween.

20 Claims, 16 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,667,223 B2 | 2/2010 | Suehiro et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,875,897 B2 | 1/2011 | Suehiro |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,072,134 B2 | 12/2011 | Erchak et al. |
| 8,129,711 B2 | 3/2012 | Kang et al. |
| 8,179,938 B2 | 5/2012 | Kim |
| 8,236,584 B1 | 8/2012 | Chem et al. |
| 8,263,987 B2 | 9/2012 | Choi et al. |
| 8,324,646 B2 | 12/2012 | Lee et al. |
| 8,329,482 B2 | 12/2012 | Yao et al. |
| 8,399,944 B2 | 3/2013 | Kwak et al. |
| 8,432,511 B2 | 4/2013 | Jeong |
| 8,455,913 B2 | 6/2013 | Epler et al. |
| 8,459,832 B2 | 6/2013 | Kim |
| 8,502,242 B2 | 8/2013 | Kim |
| 8,525,216 B2 | 9/2013 | Chen et al. |
| 8,536,604 B2 | 9/2013 | Kwak et al. |
| 8,735,931 B2 | 5/2014 | Han et al. |
| 8,766,295 B2 | 7/2014 | Kim |
| 2011/0241040 A1 | 10/2011 | Yu et al. |
| 2011/0309393 A1 | 12/2011 | Greenwood |
| 2012/0261805 A1 | 10/2012 | Sundaram et al. |
| 2013/0034921 A1 | 2/2013 | Kojima et al. |
| 2014/0199796 A1* | 7/2014 | Kim et al. .............. 438/27 |

OTHER PUBLICATIONS

Jin-Myung Kim et al., "Packaging Technology of Plat Phosphor for White LED," Korean Institute of Materials Science affiliated with Korea Institute of Machinery & Materials, Jun. 2013, pp. 21-27, with partial English translation.

* cited by examiner

LIGHT-EMITTING DIODE PACKAGE

CROSS-REFERENCE TO RELATED APPLICATION

This application claims benefit of priority to Korean Patent Application No. 10-2014-0018032, filed on Feb. 17, 2014, in the Korean Intellectual Property Office, the entire content of which is incorporated herein by reference.

TECHNICAL FIELD

The present inventive concept relates to a light-emitting diode (LED) package, and more particularly, to a structure of an LED package which may be manufactured in an ultra small size.

BACKGROUND

Generally, in an LED package including a lead frame substrate, a chip is mounted inside the package. However, in the case of such a package, an additional substrate is needed and the size of the package increases, and thus, the cost of materials and manufacture increases due to an additional package process.

SUMMARY

The inventive concept provides a light-emitting diode (LED) package of an ultra small size, in order to prevent a size increase of the package and an increase in the cost of manufacture due to an additional package process.

One aspect of the inventive concept relates to an LED package including a light-emitting structure, a first electrode pad and a second electrode pad, an insulating pattern layer, a substrate, an insulating layer, a first penetrating electrode and a second penetrating electrode, a fluorescent material layer and a glass. The first electrode pad and the second electrode pad are connected with the light-emitting structure. The insulating pattern layer is in contact with a bottom surface of the light-emitting structure and abuts the first electrode pad and the second electrode pad. The substrate includes via-holes that are in contact with a bottom surface of the insulating pattern layer and expose a portion of the first electrode pad and a portion of the second electrode pad. The first penetrating electrode and the second penetrating electrode are disposed in the via-holes and are respectively connected with the first electrode pad and the second electrode pad. The fluorescent material layer is disposed on the light-emitting structure. The glass is disposed on and spaced apart from the light-emitting structure with the fluorescent material layer between the glass and the light-emitting structure.

The fluorescent material layer may include an adhesive fluorescent material layer.

The LED package may further include an adhesive material layer disposed between the fluorescent material layer and the glass.

A first width of the substrate may be greater than a second width of the bottom surface of the light-emitting structure. The LED package may further include a support layer disposed between the adhesive material layer and the insulating pattern layer to abut the light-emitting structure.

The support layer may include an adhesive material.

The second width may be greater than a third width of an upper surface of the light-emitting structure.

The LED package may further include a growth substrate of the light-emitting structure, which is interposed between the light-emitting structure and the fluorescent material layer.

A fourth width of an upper surface of the glass may be smaller than the first width of the substrate.

The glass may be tapered from a bottom surface of the glass to an upper surface of the glass.

Another aspect of the inventive concept encompasses an LED package including a light-emitting structure, a first electrode pad and a second electrode pad, an insulating pattern layer, a substrate, an insulating layer, a first penetrating electrode and a second penetrating electrode, a fluorescent material layer, a first support layer and a glass. The first electrode pad and the second electrode pad are connected with the light-emitting structure. The insulating pattern layer is in contacts with a bottom surface of the light-emitting structure and abuts the first electrode pad and the second electrode pad. The substrate including via-holes that are in contact with a bottom surface of the insulating pattern layer and expose a portion of the first electrode pad and a portion of the second electrode pad. The first penetrating electrode and the second penetrating electrode are disposed in the via-holes and are respectively connected with the first electrode pad and the second electrode pad. The fluorescent material layer is disposed on the light-emitting structure and has a second width which is smaller than a first width of the substrate. The first support layer abuts the fluorescent material layer disposed on the light-emitting structure. The glass is disposed on and spaced apart from the light-emitting structure with the fluorescent material layer between the glass and the light-emitting structure.

The first support layer may include an adhesive material.

The first support layer may include a fluorescent material.

A third width of the bottom surface of the light-emitting structure may be smaller than the first width of the substrate. The LED package may further include a second support layer abutting the light-emitting structure between an upper layer formed of the first support layer and the fluorescent material layer and a lower layer formed of the insulating pattern layer.

The first support layer may include an adhesive fluorescent material.

A third width of the bottom surface of the light-emitting structure may be smaller than the first width of the substrate. Also, the LED may further include a second support layer abutting the light-emitting structure between an upper layer including the first support layer and the fluorescent material layer and a lower layer including the insulating pattern layer.

The first support layer and the second support layer may include an identical material.

Still another aspect of the present inventive concept relates to a dimming system including a light-emitting module and a power supply unit. The light-emitting module includes the LED package. The power supply unit includes an interface configured to receive power and includes a power control unit configured to control power supplied to the light emitting module.

Still another aspect of the present inventive concept encompasses a light-processing system including a light-source system, a light guide, a camera system and a data process and analysis system. The light-source system includes the LED package. The camera system is connected with the light source system via the light guide and configured to output an image signal. The data process and analysis system is configured to process, analyse and store the image signal outputted from the camera system.

Still another aspect of the present inventive concept relates to a light-emitting diode (LED) package including a light-emitting structure, a first electrode pad and a second electrode pad, an insulating pattern layer, a substrate, an insulating layer, and a first penetrating electrode and a second penetrating electrode. The light-emitting structure includes a first semiconductor layer, an active layer and a second semiconductor layer. The first electrode pad and the second electrode pad are respectively connected with the first semiconductor layer and the second semiconductor layer of the light-emitting structure. The insulating pattern layer is in contact with a bottom surface of the light-emitting structure and disposed between the first electrode pad and the second electrode pad. The substrate includes via-holes that penetrate the substrate and expose a portion of the first electrode pad and a portion of the second electrode pad. The first penetrating electrode and the second penetrating electrode are disposed in the via-holes and are respectively connected with the first electrode pad and the second electrode pad. A first width of the bottom surface of the light-emitting structure is greater than a second width of an upper surface of the light-emitting surface and smaller than a third width of the substrate.

BRIEF DESCRIPTION OF THE DRAWINGS

The above and other aspects, features and other advantages of the inventive concept will be more clearly understood from the following detailed description taken in conjunction with the accompanying drawings in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
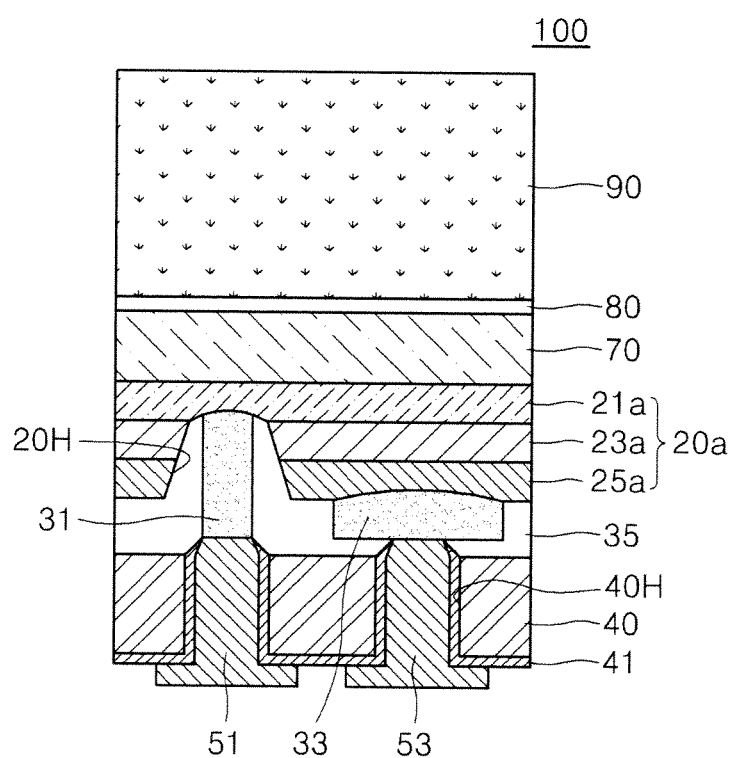
FIGS. 1 through 6 are cross-sectional views of light-emitting diode (LED) packages according to exemplary embodiments of the inventive concept.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. Like reference numerals in the drawings denote like elements, and thus their description will be omitted. In the drawings, the thicknesses of layers and regions are exaggerated for clarity.

The terminology used herein is for describing particular embodiments and is not intended to be limiting of exemplary embodiments. As used herein, the singular forms "a," "an," and "the," are intended to include the plural forms as well, unless the context clearly displays otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, "an upper surface" and "a bottom surface" respectively denote an upper portion and a bottom portion in the drawings.

Hereinafter, exemplary embodiments of the inventive concept will be described in detail with reference to the accompanying drawings.

FIG. 1 is a cross-sectional view of a light-emitting diode (LED) package 100 according to exemplary embodiments of the inventive concept.

Referring to FIG. 1, the LED package 100 may include a light-emitting structure 20a, a first electrode pad 31 and a second electrode pad 33, an insulating pattern layer 35, a substrate 40, an insulating layer 41, and a first penetrating electrode 51 and a second penetrating electrode 53. The first electrode pad 31 and a second electrode pad 33 may be connected with the light-emitting structure 20a below the light-emitting structure 20a. The insulating pattern layer 35 may define or abut the first electrode pad 31 and the second electrode pad 33 and may be in contact with a bottom surface of the light-emitting structure 20a. The substrate 40 may include via-holes 40H in contact with a bottom surface of the insulating pattern layer 35 and expose the first electrode pad 31 and the second electrode pad 33. The insulating layer 41 may cover a bottom surface of the substrate 40 and inner walls of the via-holes 40H. The first penetrating electrode 51 and the second penetrating electrode 53 may be respectively connected with the first electrode pad 31 and the second electrode pad 33. Also, above the light-emitting structure 20a, the LED package 100 may include a fluorescent material layer 70 formed on an upper surface of the light-emitting structure 20a, an adhesive material layer 80 formed on the fluorescent material layer 70, and a glass 90 formed on the adhesive material layer 80.

The light-emitting structure 20a may include a first semiconductor layer 21a, a second semiconductor layer 25a, and an active layer 23a interposed between the first semiconductor layer 21a and the second semiconductor layer 25a. The first semiconductor layer 21a and the second semiconductor layer 25a may be a p-type semiconductor layer and an n-type semiconductor layer, respectively, or vice versa. In some embodiments of the present inventive concept, the first semiconductor layer 21a may include an n-GaN layer and the second semiconductor layer 25a may include a p-GaN layer.

The active layer 23a may emit light having a predetermined energy by recombination of electrons and holes, and may be formed as a multi quantum well (MQW) structure in which a quantum well layer and a quantum barrier layer are alternately stacked. In some embodiments of the present inventive concept, the MQW structure may include an InGaN/GaN structure.

The structure below the light-emitting structure 20a will be described first. A contact hole 20H may be formed in the light-emitting structure 20a to penetrate the second semiconductor layer 25a and the active layer 23a to expose a portion of the first semiconductor layer 23a.

The first electrode pad 31 may be formed in the contact hole 20H to be connected with the first semiconductor layer 21a and the second electrode pad 33 may be formed in the contact hole 20H to be connected with the second semiconductor layer 25a. The second electrode pad 33 may be formed to be wider than the first electrode pad 31. The insulating pattern 35 may be formed to cover an inner portion of the contact hole 20H and side walls of the first electrode pad 31 and the second electrode pad 33 so as to define or abut the first electrode pad 31 and the second electrode pad 33. The insulating pattern 35 may be formed to cover a portion of a bottom surface of the first electrode pad 31 and a portion of a bottom surface of the second electrode pad 33. The first electrode pad 31 may be electrically separated from the active layer 23a and the second electrode pad 33 by being surrounded by the insulating pattern 35.

The substrate 40 may include the via-holes 40H in contact with the bottom surface of the insulating pattern 35 and expose a portion of the first electrode pad 31 and a portion of the second electrode pad 33. The via-holes 40H may be appropriately adjusted in teems of their shapes and pitches to lower a contact resistance between the first electrode pad 31 and the first penetrating electrode 51 and between the second electrode pad 33 and the second penetrating electrode 53. The insulating layer 41 may be formed in inner walls of the via-holes 40H and in the bottom surface of the substrate 40. In some embodiments of the present inventive concept, the substrate 40 may be formed of silicon (Si) or Si doped with impurities.

The first penetrating electrode 51 and the second penetrating electrode 53 may be formed to fill the via-holes 40H covered by the insulating layer 41 to be respectively connected with the first electrode pad 31 and the second electrode pad 33. The first penetrating electrode 51 and the second penetrating electrode 53 may be respectively connected with a first external connection terminal and a second external connection terminal which are formed to cover a portion of the bottom surface of the substrate 40 covered by the insulating layer 41. In some embodiments of the present inventive concept, the first penetrating electrode 51 and the first external connection terminal, and the second penetrating electrode 53 and the second external connection terminal may be integrally formed.

Next, the structure above the light-emitting structure 20a will be described.

The fluorescent material layer 70 may be formed on an upper surface of the light-emitting structure 20a. The fluorescent material layer 70 may include a methyl-based fluorescent material, a phenyl-based fluorescent material, or a YAG ($Y_3Al_5O_{12}$)-based fluorescent material. The fluorescent material layer 70 may convert light generated from the light-emitting structure 20a into a desired light color. The adhesive material layer 80 may be formed on the fluorescent material layer 70. The adhesive material layer 80 may be a material layer to make the fluorescent material layer 70 and the glass 90 adhere to each other. In some embodiments of the present inventive concept, the adhesive material layer 80 may include a silicone resin or an epoxy resin. In some embodiments of the present inventive concept, the fluorescent material layer 70 may include an adhesive fluorescent material layer, and in this case, the adhesive material layer 80 may be omitted.

The glass 90 may be formed on the adhesive material layer 80. The light generated from the active layer 23a may pass through the glass 90. The glass 90 may play a role of enhancing the durability of the LED package 100 against external shocks. Also, the glass 90 may support the substrate 40, which has a low mechanical intensity, in a process of forming the via-holes 40H in the substrate 40, thereby allowing the substrate 40 to be ground to be sufficiently thin. Accordingly, pitch sizes of the via-holes 40H may be reduced to prevent an occurrence of voids in the via-holes 40H, and thus, the operating reliability of the LED may increase.

Figure 2:
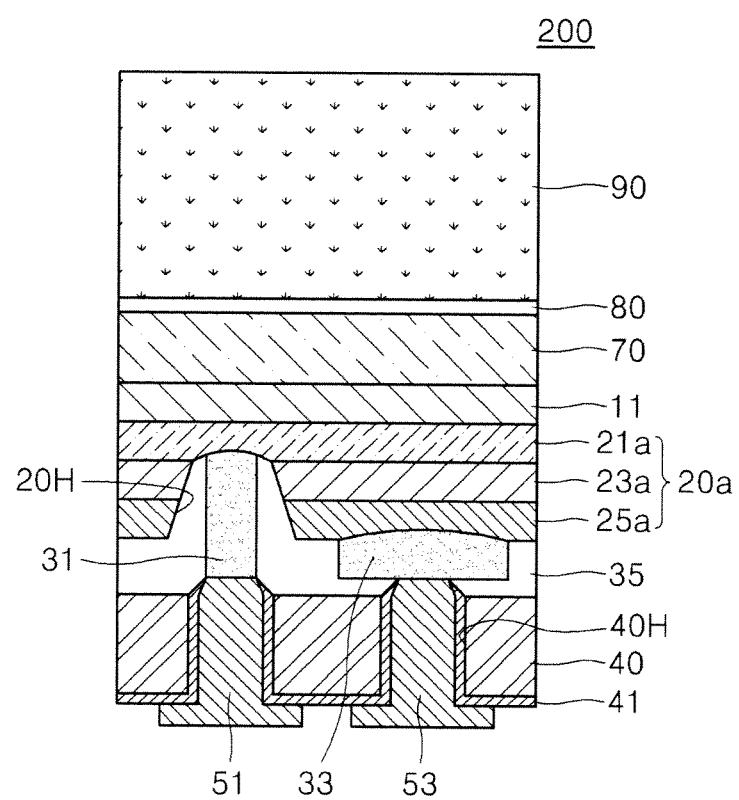

FIG. 2 is a cross-sectional view of an LED package 200 according to exemplary embodiments of the inventive concept. In FIGS. 2 through 20, like reference numerals in FIG. 1 denote like elements, and their detailed descriptions will not be repeated.

Referring to FIG. 2, the LED package 200 of FIG. 2 may be different from the LED package 100 of FIG. 1 in that the LED package 200 may further include a growth substrate 11 of the light-emitting structure 20a, which is interposed between the light-emitting structure 20a and the fluorescent material layer 70.

The growth substrate 11 may be an element that is used in a process of depositing the light-emitting structure 20a. In the LED package 200 of FIG. 2, the first semiconductor layer 21a, the active layer 23a, and the second semiconductor layer 25a may be sequentially deposited on the growth substrate 11 to form the light-emitting structure 20a. Then, all of the growth substrate 11 may be removed and the fluorescent layer 70 may be formed on the light-emitting structure 20a. Alternatively, in the LED package 200 according to exemplary embodiments of the present inventive concept, all of or a portion of the growth substrate 11 may not be removed. A portion of a growth substrate 10 of FIGS. 7 through 17 may be removed to form the growth substrate 11 of FIG. 2. In some embodiments of the present inventive concept, the growth substrate 11 may be formed of a transparent material.

Figure 3:
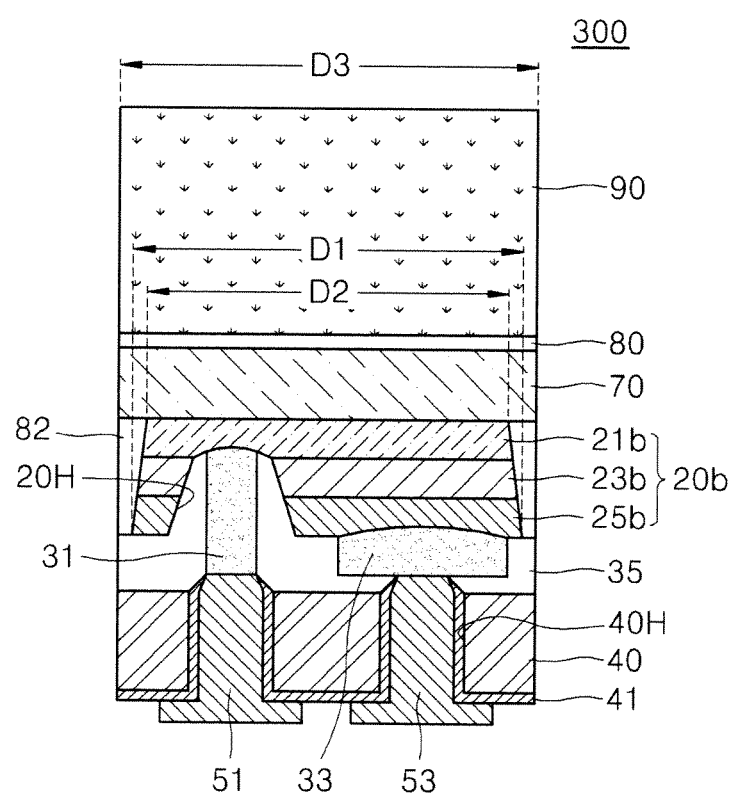

FIG. 3 is a cross-sectional view of an LED package 300 according to exemplary embodiments of the inventive concept.

Referring to FIG. 3, the LED package 300 may be different from the LED package 100 of FIG. 1 in that the LED package 300 may have a different light-emitting structure 20b and further includes a support layer 82.

A first width D1 of a bottom surface of the light-emitting structure 20b and a second width D2 of an upper surface of the light-emitting structure 20b may be smaller than a third width D3 of the substrate 40, thereby allowing a sawing line not to be in contact with the light-emitting structure 20b, when an LED package according to an exemplary embodiment of the inventive concept is formed at a wafer level and is finally sawed in a chip size. When the first semiconductor layer 21b, the active layer 23b, and the second semiconductor layer 25b are directly sawed mechanically, cracks may occur on the semiconductor layers 21b and 25b, and the active layer 23b. The LED package 300 may prevent such a problem and protect the light-emitting structure 20b.

The first width D1 may be greater than the second width D2. It is illustrated in FIG. 3 that the first width D1 is greater than the second width D2. However, the inventive concept is not limited thereto, and shapes of widths according to a height of the light-emitting structure 20b may include various shapes of widths that can be formed by an etching process which removes edges of the light-emitting structure 20b.

The support layer 82 may be formed between the fluorescent material layer 70 and the insulating pattern layer 35 to define or abut the light-emitting structure 20b. The support layer 82 may support between the insulating pattern 35 and the adhesive material layer 80. The support layer 82 may include an adhesive material layer and function to make the insulating pattern 35 and the adhesive material layer 80 adhere to each other. In some embodiments of the present inventive concept, the support layer 82 may be a silicone resin or an epoxy resin.

In some embodiments of the present inventive concept, the second width D2 of the upper surface of the light-emitting structure 20b may be smaller than the first width D1 of the bottom surface of the light-emitting structure 20b.

In some embodiments of the present inventive concept, the first width D1 of the bottom surface of the light-emitting structure 20b may be the same as the third width D3 of the substrate 40.

Figure 4:
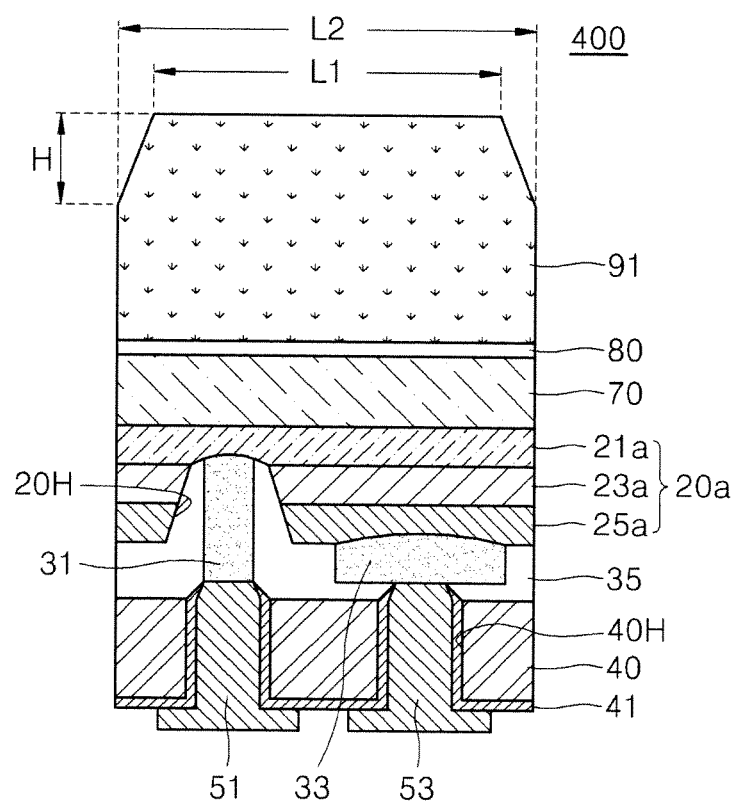

FIG. 4 is a cross-sectional view of an LED package 400 according to exemplary embodiments of the inventive concept.

Referring to FIG. 4, the LED package 400 may be different from the LED package 100 of FIG. 1 in that the LED package 400 may have a glass 91 having a shape different from the shape of the glass 90.

A first width L1 of an upper surface of the glass 91 of the LED package 400 may be smaller than a second width L2 of the substrate 40. This may be formed by performing an etching process along a sawing line before performing a mechanical sawing process along the sawing line, when an LED package according to an exemplary embodiment of the inventive concept is formed at a wafer level and is finally sawed in a chip size. By performing the etching process along the sawing line, grooves may be formed at edges of the glass 91 by a predetermined depth H from the upper surface of the glass 91. Accordingly, the first width L1 of the upper surface of the glass 91 may be smaller than the second width L2 of the substrate 40.

In some embodiments of the present inventive concept, the glass 91 may be tapered from a predetermined point of a vertical height of the glass 91 to the upper surface of the glass 91. In some embodiments of the present inventive concept, the glass 91 may be tapered from a bottom surface of the glass 91 to the upper surface of the glass 91.

It is illustrated in FIG. 4 that widths get smaller from the second width L2 to the first width L1, however, the inventive concept is not limited thereto. Shapes of widths according to a height of the glass 91 may include various shapes of widths that can be formed by the etching process along a sawing surface of the glass 91.

Figure 5:
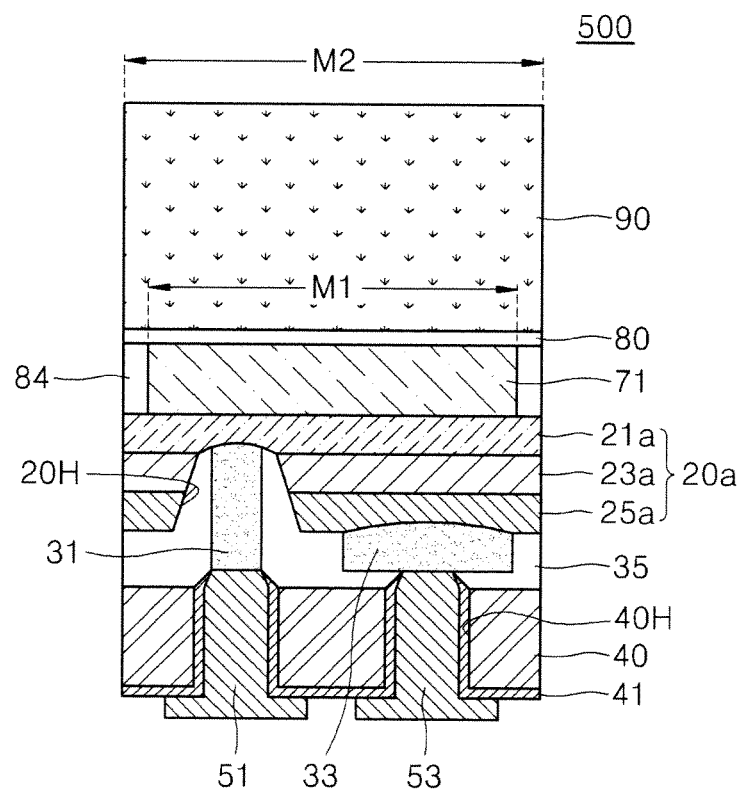

FIG. 5 is a cross-sectional view of an LED package 500 according to exemplary embodiments of the inventive concept.

Referring to FIG. 5, the LED package 500 may be different from the LED package 100 of FIG. 1 in that the LED package 500 may have a fluorescent material layer 71 having a shape different from the shape of the fluorescent material layer 70 and may further include a support layer 84.

A first width M1 of the fluorescent material layer 71 formed on the light-emitting structure 20a may be smaller than a second width M2 of the substrate 40. Such a structure may be formed by separating the fluorescent material layer 71 in a chip size and arranging the separated fluorescent material layer 71 on the light-emitting structure 20a.

The support layer 84 may be formed between the adhesive material layer 80 and the light-emitting structure 20a to define or abut the fluorescent material layer 71. The support layer 84 may support between the adhesive material layer 80 and the light-emitting structure 20a. Also, the support layer 84 may include an adhesive material layer such that the adhesive material layer 80 and the light-emitting structure 20a adhere to each other. In some embodiments of the present inventive concept, the support layer 84 may be a silicone resin or an epoxy resin.

The support layer 84 may include a fluorescent material layer. In this case, a portion of a light generated from the light-emitting structure 20a may pass through the support layer 84 and may be converted to a desired color of light.

In some embodiments of the present inventive concept, the support layer 84 may include an adhesive fluorescent material layer.

Figure 6:
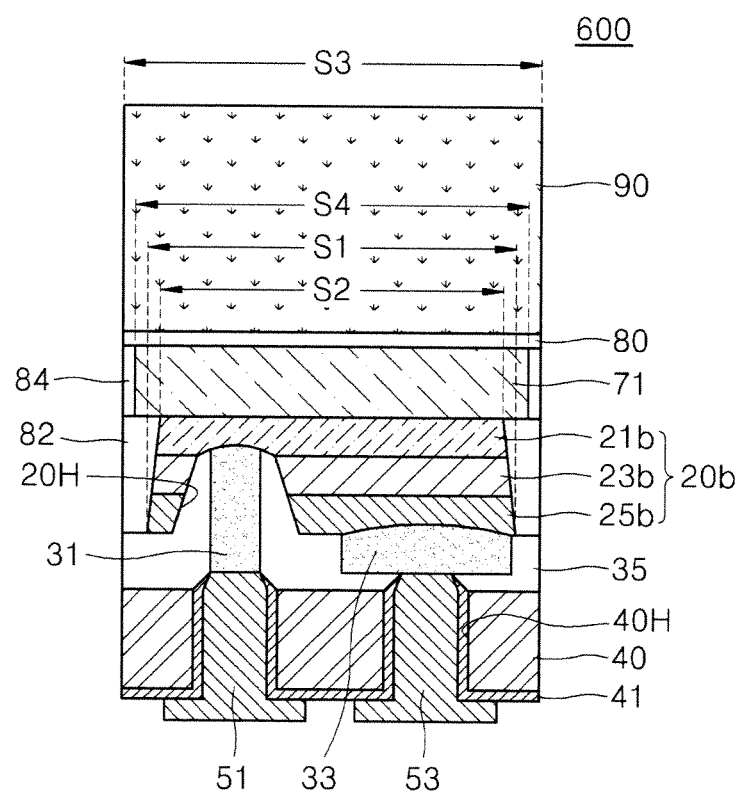
Figure 7:
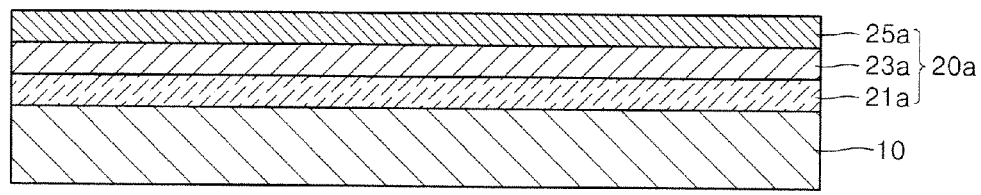
FIGS. 7 through 17 are cross-sectional views for describing processes for manufacturing an LED package, according to exemplary embodiments of the inventive concept.
Figure 8:
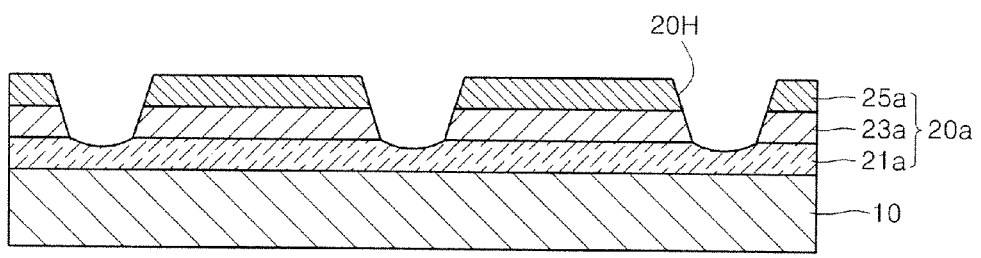
Figure 9:
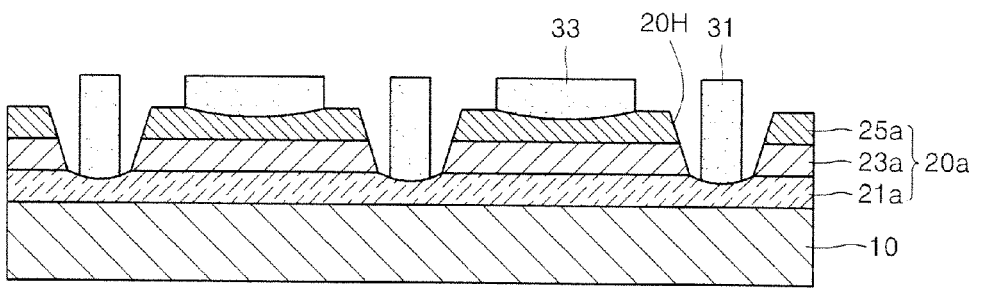
Figure 10:
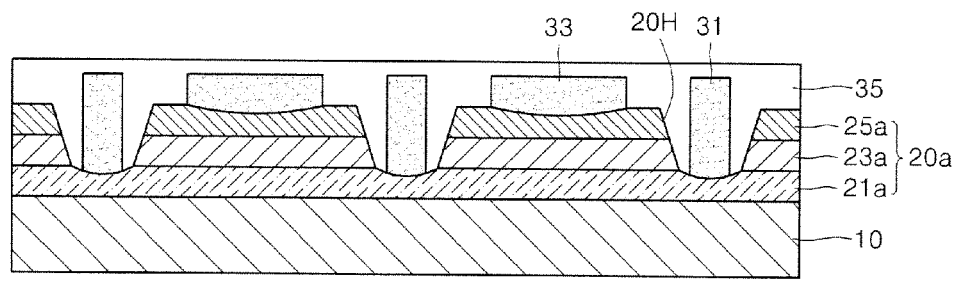

FIG. 6 is a cross-sectional view of an LED package 600 according to exemplary embodiments of the inventive concept.

Referring to FIG. 6, the LED package 600 may be different from the LED package 500 of FIG. 5 in that the LED package 600 may have the light-emitting structure 20b having a shape different from the shape of the light-emitting structure 20b of FIG. 5, and may further include the second support layer 82.

A first width S1 of a bottom surface of the light-emitting structure 20b and a second width S2 of an upper surface of the light-emitting structure 20b may be smaller than a third width S3 of the substrate 40. As described above, the light-emitting structure 20b has such a shape in order to prevent cracks that may occur on the semiconductor layers 21b and 25b, and the active layer 23b when the semiconductor layers 21b and 25b, and the active layer 23b are directly sawed mechanically.

The first width S1 of the light-emitting structure 20b may be greater than the second width S2. It is illustrated in FIG. 6 that the first width S1 is greater than the second width S2, however the inventive concept is not limited thereto. Shapes of widths according to a height of the light-emitting structure 20b may include various shapes of widths that can be formed by an etching process that removes edges of the light-emitting structure 20b.

The first support layer 84 may be formed between the adhesive material layer 80 and the light-emitting structure 20b to define or abut the fluorescent material layer 71. The second support layer 82 may be formed between an upper layer formed of the first support layer 84 and the fluorescent material layer 71 and a lower layer formed of the insulating pattern layer 35 to define or abut the light-emitting structure 20b. The second support layer 82 may support between the upper layer formed of the first support layer 84 and the fluorescent material layer 71, and the lower layer formed of the insulating pattern 35. The second support layer 82 may include an adhesive material layer such that the upper layer and the lower layer adhere to each other. In some embodiments of the present inventive concept, the second support layer 82 may be a silicone resin or an epoxy resin.

In some embodiments of the present inventive concept, the first width S1 of the bottom surface of the light-emitting structure 20b may be the same as the third width S3 of the substrate 40.

In some embodiments of the present inventive concept, the first support layer 84 and the second support layer 82 may include the same material layer as each other. For example, the first support layer 84 and the second support layer 82 may include an adhesive material layer, a fluorescent material layer, or an adhesive fluorescent material layer.

In some embodiments of the present inventive concept, a fourth width S4 of the fluorescent material layer 71 may be greater than the first width SI of the bottom surface of the light-emitting structure 20b.

FIGS. 7 through 20 are cross-sectional views for describing a method of manufacturing an LED package according to exemplary embodiments of the inventive concept.

In FIGS. 7 through 17, the method of manufacturing the LED package 100 of FIG. 1 will be described, according to exemplary embodiments of the inventive concept.

Referring to FIGS. 7 through 10, the first semiconductor layer 21a, the active layer 23a, and the second semiconductor layer 25a of the light-emitting structure 20a may be sequentially grown on a cylindrical surface of a growth substrate 10. The substrate 10 may be formed of a material, such as sapphire, SiC, or GaN. The contact hole 20H may be formed in the light-emitting structure 20a by etching portions of the active layer 23a and the second semiconductor layer 25a to expose at least a portion of the first semiconductor layer 21a (see FIG. 8). The first electrode pad 31 connected with the first semiconductor layer 21a that is exposed in the contact hole 20H and the second electrode pad 33 connected with the second semiconductor layer 25a may be formed by using a mask pattern (not shown) that defines the first electrode pad 31 and the second electrode pad 33 (see FIG. 9). Then, the mask pattern may be removed. And then, the insulating pattern 35 may be formed to define or abut the first electrode pad 31 and the second electrode pad 33 and cover a surface of the light-emitting structure 20a (see FIG. 10). In this case, the insulating pattern 35 may be formed to cover upper surfaces of the first electrode pad 31 and the second electrode pad 33.

Figure 11:
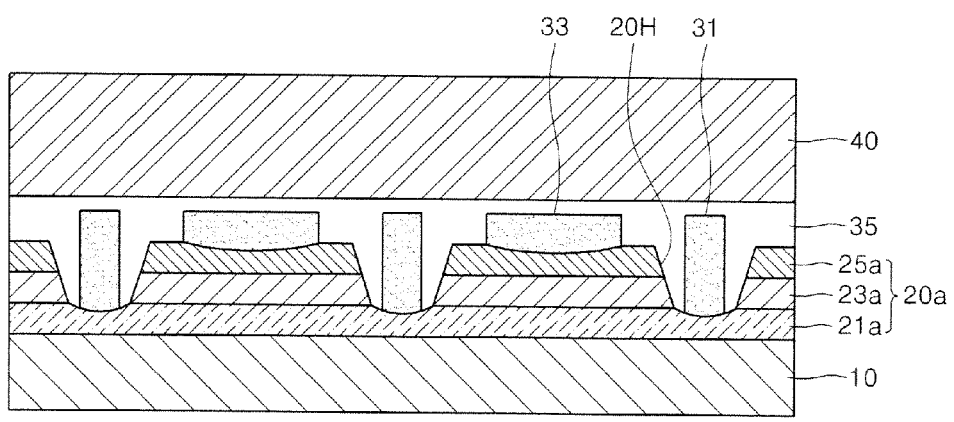

Referring to FIG. 11, the substrate 40 may be made adhere to the insulating pattern 35 at a wafer level. For improved support intensity in the manufacturing process, the substrate 40 may be thicker than a substrate required in the completed LED package 100. As it will be described later, the substrate 40 may be ground to be sufficiently thin in an operation of FIG. 14 to satisfy the thickness required by the LED package 100.

Figure 12:
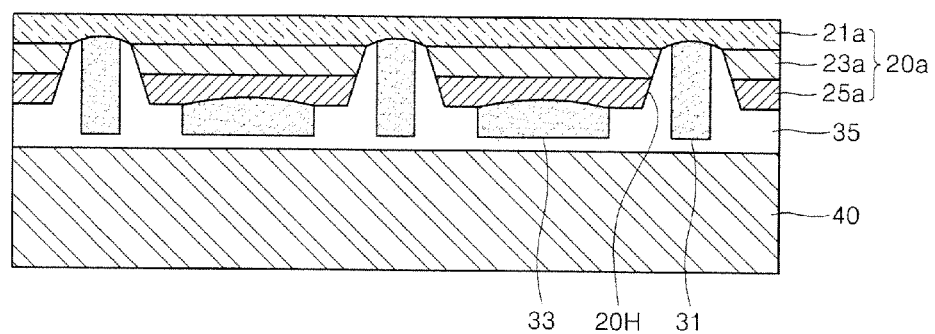

Referring to FIG. 12, the growth substrate 10 of the light-emitting structure 20a may be removed or separated from the light-emitting structure 20a by performing an etching process or a mechanical removal process. The removal process of the growth substrate 10 may also be performed even when the upper surface and the bottom surface of a product of the operation of FIG. 11 are reversed.

All or a portion of the growth substrate 10 may not be removed, according to necessity. The LED package 200 of FIG. 2 may be manufactured such that only a portion of the growth substrate 10 of FIG. 12 is removed and the growth substrate 11 having a smaller thickness than the growth substrate 10 on which the light-emitting structure 20a is grown remains between the light-emitting structure 20a and the fluorescent material layer 70.

Figure 13:
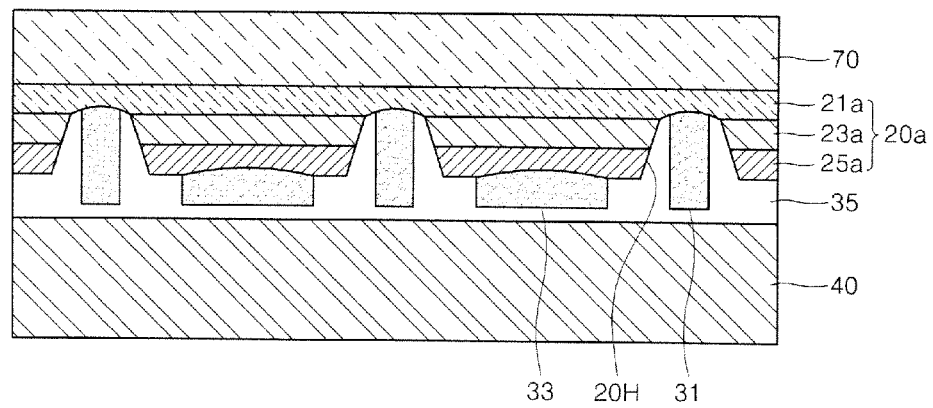

Referring to FIG. 13, the fluorescent material layer 70 may be formed at a wafer level to cover an entire upper surface of the light-emitting structure 20a. An adhesive material layer may be formed between the fluorescent material layer 70 and the first semiconductor layer 21a to make the fluorescent material layer 70 adhere to the first semiconductor layer 21a of the light-emitting structure 20a.

Figure 14:
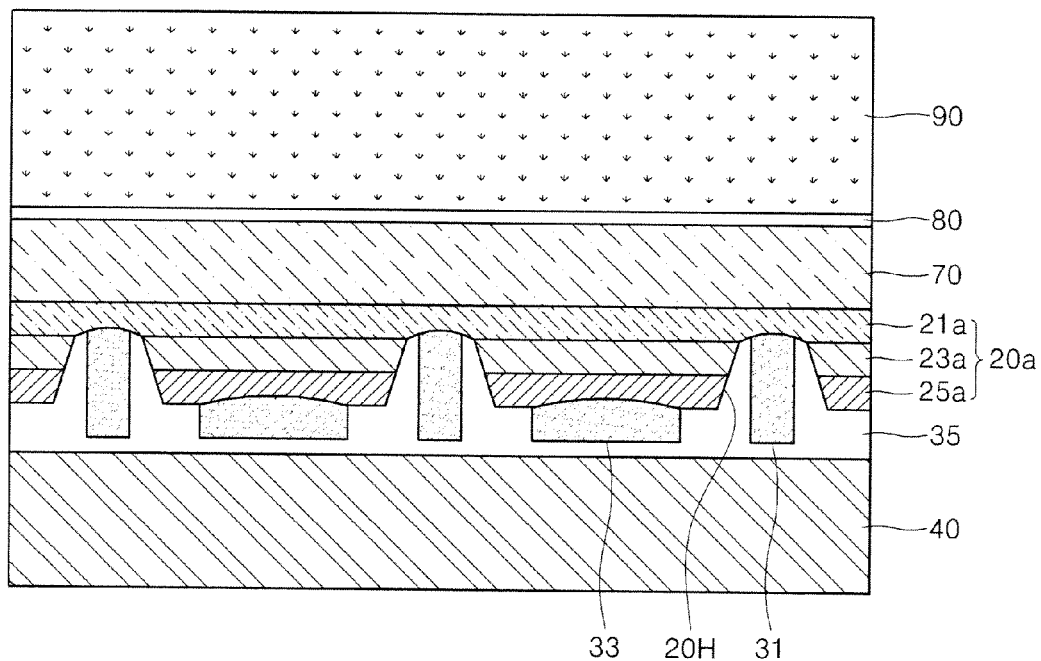

Referring to FIG. 14, the adhesive material layer 80 may be formed to cover an entire surface of the fluorescent material layer 70. However, when the fluorescent material layer 70 includes the adhesive fluorescent material layer as described above, the process of forming the adhesive material layer 80 may be omitted.

The glass 90 may be formed on the adhesive material layer 80. The glass 90 may be formed to be sufficiently thick to maintain a mechanical intensity of the LED package 100 of FIG. 1. As the glass 90 adheres to the adhesive material layer 80, the LED package 100 at a wafer level may maintain sufficient support intensity without a help of the substrate 40. Accordingly, the substrate 40 may go through an operation of being ground to be sufficiently thin to satisfy the thickness desired by the LED package 100. Since the substrate 40 is ground to be sufficiently thin, a depth of the substrate 40 may be small, and thus, a pitch of a via-hole formed in the substrate 40 may be selectively adjusted and an occurrence of voids that may be generated when forming a penetrating electrode by filling the via-hole may be prevented.

Figure 15:
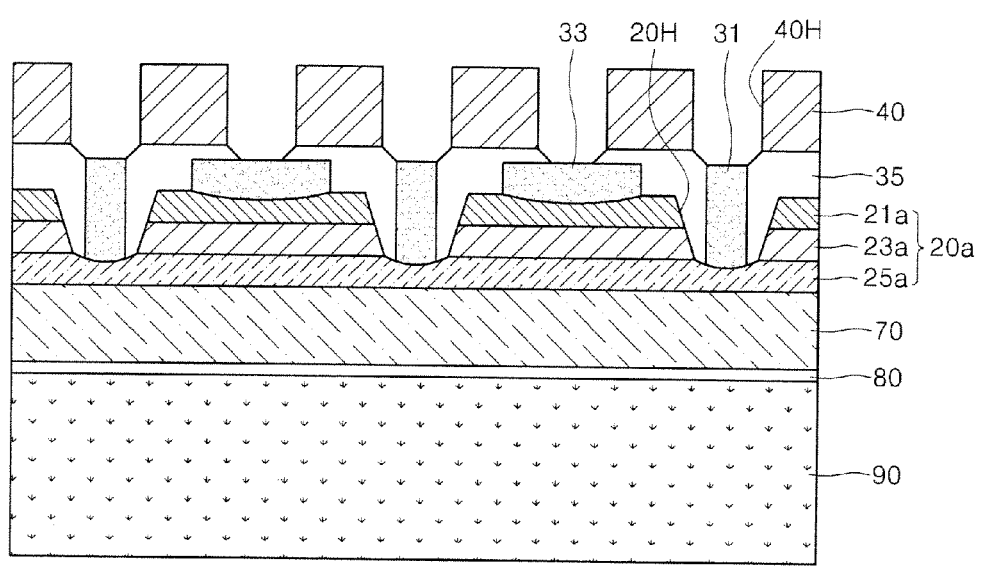

Referring to FIG. 15, the via-holes 40H may be formed in the substrate 40 to expose portions of the first electrode pad 31 and the second electrode pad 33. The via-holes 40H may be formed by an etching process by using a mask pattern (not shown).

Figure 16:
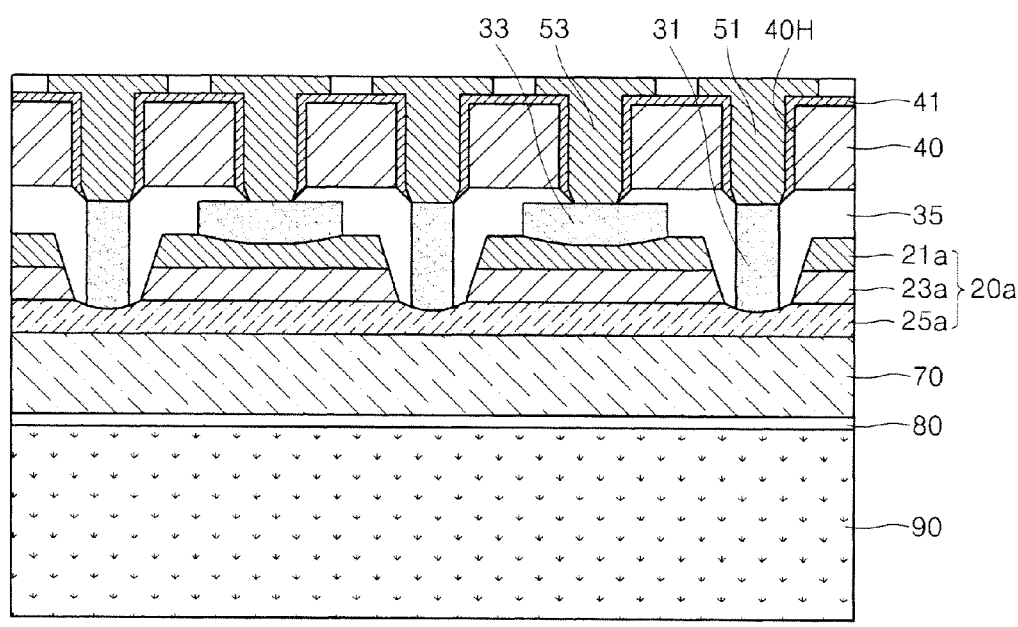

Referring to FIG. 16, the insulating layer 41 may be formed to expose partial surfaces of the first electrode pad 31 and the second electrode pad 33 and to cover inner walls of the via-holes 40H and an upper surface of the substrate 40. The first penetrating electrode 51 may be formed by filling, with an electrode material, the via-hole 40H, the inner walls of which are covered by the insulating layer 41 and through which a partial upper surface of the first electrode pad 31 is exposed. Likewise, the second penetrating electrode 53 may be formed by filling, with an electrode material, the via-hole 40H, the inner walls of which are covered by the insulating layer 41 and through which a partial upper surface of the second electrode pad 33 is exposed. In some embodiments of the present inventive concept, a first external connection terminal and a second external connection terminal respectively connected with the upper surfaces of the first penetrating electrode 51 and the second penetrating electrode 53 may further be formed.

Figure 17:
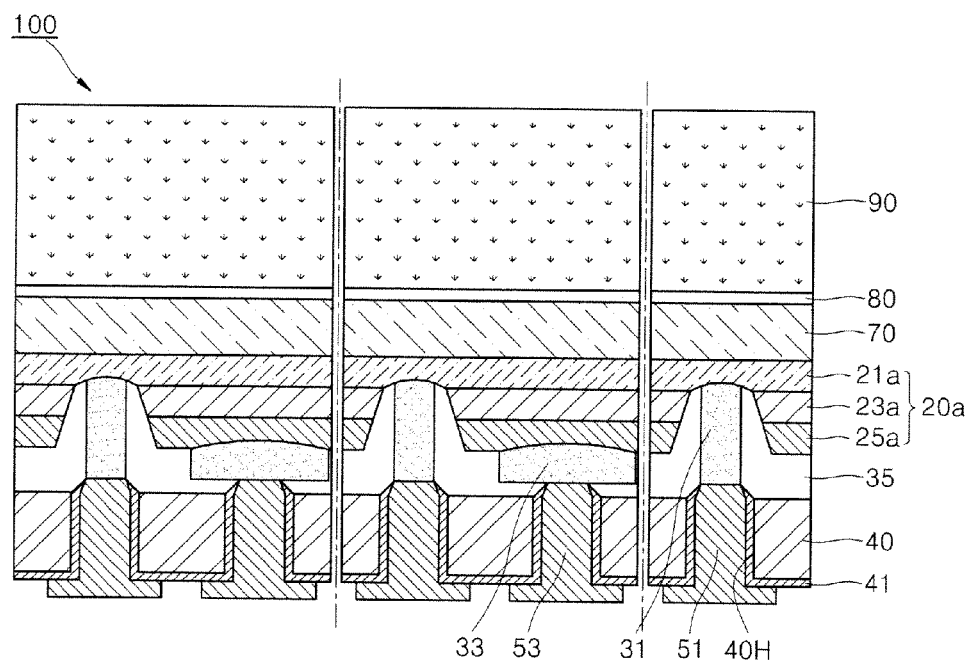

Referring to FIG. 17, the upper surface and the bottom surface of a product of the operation of FIG. 16 may be reversed. A chip unit may be determined to include at least one pair of the first electrode pad 31 and the second electrode pad 33, and a resulting product thereof, formed at a wafer level, may be sawed in a chip size, to manufacture the LED package 100.

Figure 18:
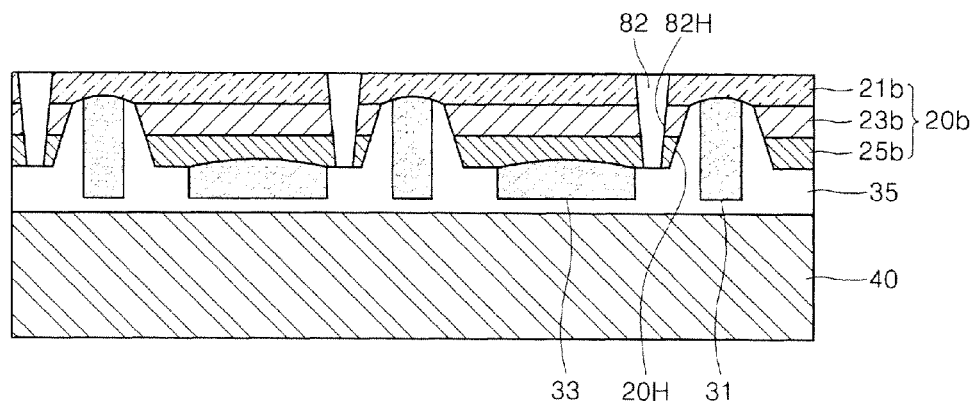
FIG. 18 is a cross-sectional view for describing an additional process for manufacturing an LED package, according to exemplary embodiments of the inventive concept.

FIG. 18 is a cross-sectional view for describing a method of manufacturing the LED package 300, according to exemplary embodiments of the inventive concept. The method of manufacturing the LED package 300 may include the method steps of manufacturing the LED package 100, as illustrated in FIGS. 7 through 17. However, the method of manufacturing the LED package 300 may further include an operation of FIG. 18 between the operation of FIG. 12 and the operation of FIG. 13.

Referring to FIG. 18, a narrow trench 82H may be formed in the light-emitting structure 20b by removing a portion of the light-emitting structure 20a (see FIG. 12) along a sawing line along which the light-emitting structure 20a formed in the operation of FIG. 12 is to be sawed in a chip size. The light-emitting structure 20b at a wafer level may be separated in a chip size by the trench 82H. The support layer 82, which is an adhesive material, may be formed in the trench 82H. The support layer 82 may space the light-emitting structure 20b apart from the sawing line to prevent cracks that may occur on the light-emitting structure 20b in the operation of sawing the LED package 300 at a wafer level in a chip size.

Sequential processes of FIGS. 13 through 17 may be performed on an entire surface of the light-emitting structure 20b and the support layer 82, as illustrated in FIG. 18, to manufacture the LED package 300. In this case, the light-emitting structure 20a in the sequential processes of FIGS. 13 through 17 may be the light-emitting structure 20b and the support layer 82, as illustrated in FIG. 18.

Figure 19:
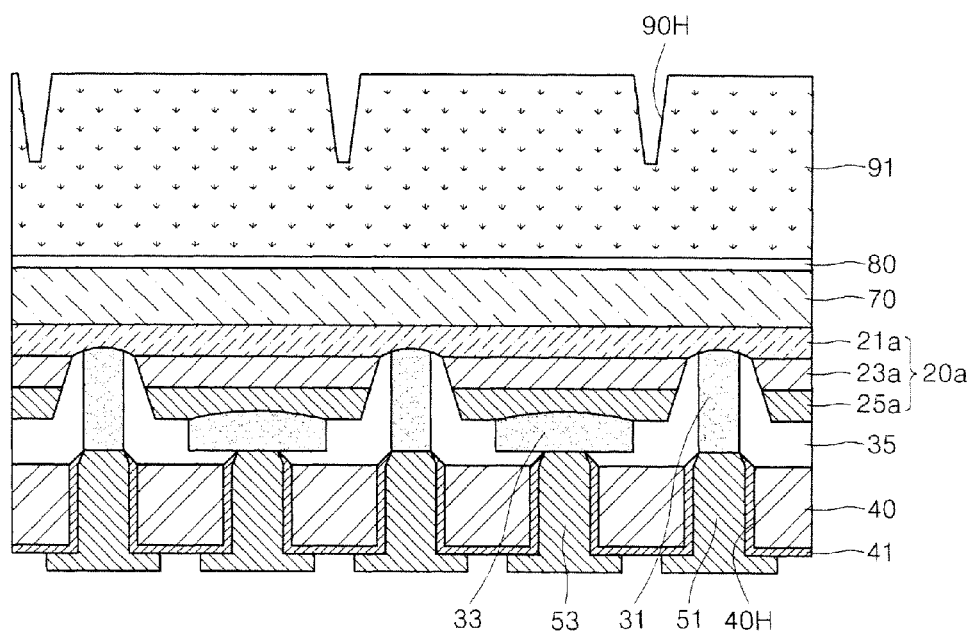
FIG. 19 is a cross-sectional view for describing an additional process for manufacturing an LED package, according to exemplary embodiments of the inventive concept.

FIG. 19 is a cross-sectional view for describing a method of manufacturing an LED package 400, according to exemplary embodiments of the inventive concept. The method of manufacturing the LED package 400 may basically include the method steps of manufacturing the LED package 100 as illustrated in FIGS. 7 through 17. However, the method of manufacturing the LED package 400 may further include an operation of FIG. 19 between the operation of FIG. 16 and the operation of FIG. 17.

Referring to FIG. 19, the glass 90 formed in the operation of FIG. 16 may be etched along a sawing line along which the glass 90 is to be sawed in a chip size, in order to form a narrow groove 90H on the glass 90. The groove 90H formed on the glass 91 may solve the problem that the glass 90 of FIG. 16 is not easily sawed due to its mechanical intensity when the LED package 400 at a wafer level is sawed in a chip size.

A sequential process as illustrated in FIG. 17 may be performed on an entire surface of the glass 91 to manufacture the LED package 400. In this case, the glass 90 in the sequential process of FIG. 17 may be the glass 91 of FIG. 19.

Figure 20:
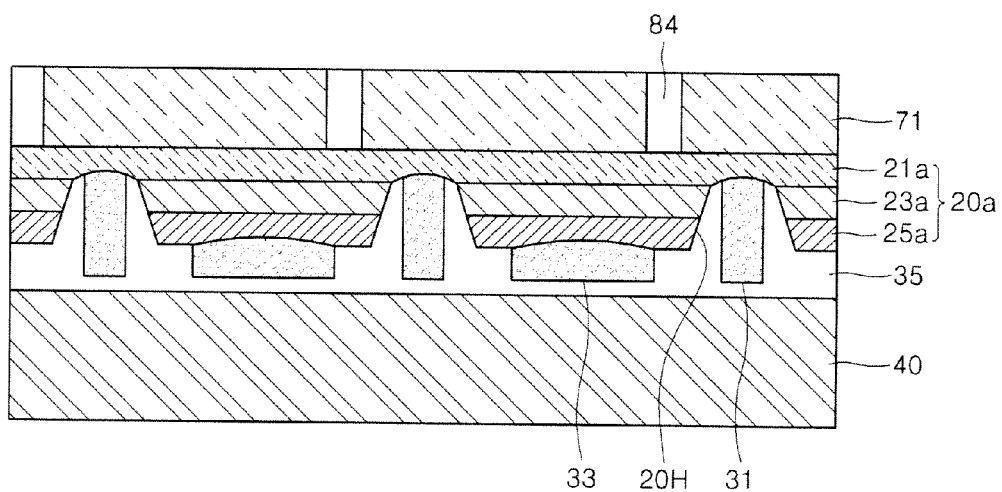
FIG. 20 is a cross-sectional view for describing a process performed instead of the process of FIG. 13 for manufacturing LED packages, according to exemplary embodiments of the inventive concept.

FIG. 20 is a cross-sectional view for describing a method of manufacturing an LED package 500, according to exemplary embodiments of the inventive concept. The method of manufacturing the LED package 500 may include the method steps of manufacturing the LED package 100 as illustrated in FIGS. 7 through 17. However, the method of manufacturing the LED package 500 includes an operation of FIG. 20 instead of the operation of FIG. 13.

When the LED package 100 is manufactured in FIG. 13, the fluorescent material layer 70 may be formed at a wafer level to cover the entire upper surface of the light-emitting structure 20a. However, referring to FIG. 20, according to the operation of FIG. 20 instead of the operation of FIG. 13, the fluorescent material layer 71 may be formed on the light-emitting structure 20a in a separated form in a chip size. In this case, the fluorescent material layer 71 may be formed to cover the upper surface of the light-emitting structure 20a including at least one pair of the first electrode pad 31 and the second electrode pad 33. As a result, a plurality of the fluorescent material layers 71 may be formed on the light-emitting structure 20a with predetermined gaps from one another.

An adhesive material, a fluorescent material, or an adhesive fluorescent material may be spread on an upper surface of the above product, and a portion of a resulting product may be etched to form the support layer 84 filling the gaps between the plurality of fluorescent material layers 71 and being in contact with the upper surface of the light-emitting structure 20a.

Sequential processes of FIGS. 14 through 17 may be performed on an entire surface of the fluorescent material layer 71 and the support layer 84, as illustrated in FIG. 20, to manufacture the LED package 500. In this case, the fluorescent material layer 70 in the sequential processes of FIGS. 14 through 17 may be the fluorescent material layer 71 and the support layer 84 of FIG. 20.

A method of manufacturing an LED package 600 will be described, by referring again to FIGS. 18 and 20. According to the operation of FIG. 18, which may be performed after the operation of FIG. 12, the second support layer 82 and the light-emitting structure 20b may be formed, and, the first support layer 84 and the fluorescent material layer 71 according to the operation of FIG. 20 instead of the operation of FIG. 13 may be formed on an entire surface of the second support layer 82 and the light-emitting structure 20b. Then, the sequential processes of FIGS. 14 through 17 may be performed to manufacture of the LED package 600. In this case, the light-emitting structure 20a in the sequential processes of FIGS. 14 through 17 may be the light-emitting structure 20b and the support layer 82, and the fluorescent material layer 70 may be the fluorescent material layer 71 and the first support layer 84.

Figure 21:
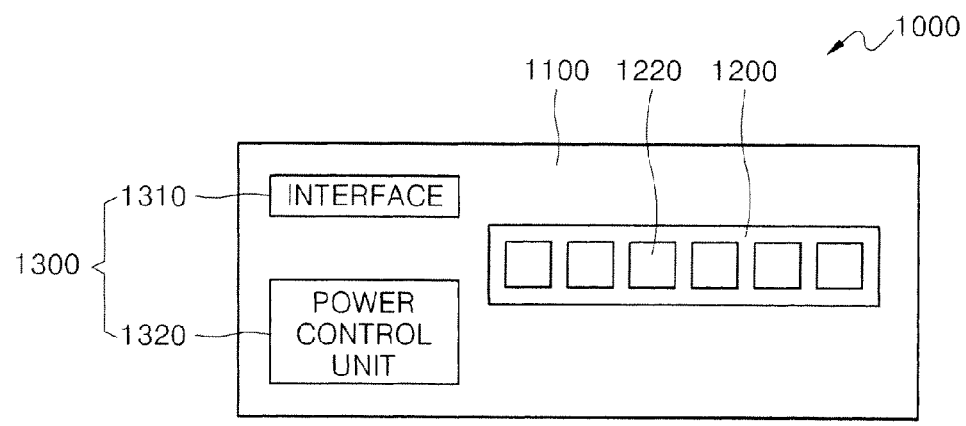
FIG. 21 is a view of a dimming system including a semiconductor light-emitting device, according to exemplary embodiments of the inventive concept.

FIG. 21 is a view of a dimming system 1000 including a semiconductor light-emitting device, according to exemplary embodiments of the inventive concept.

Referring to FIG. 21, the dimming system 1000 may include a light-emitting module 1200 and a power supply unit 1300 arranged on a structure 1100.

The light-emitting module 1200 may include a plurality of LED packages 1220. The LED package 1220 may include at least one selected from the LED packages 100, 200, 300, 400, 500, and 600 described with reference to FIGS. 1 through 6.

The power supply unit 1300 may include an interface 1310 for receiving a power and a power control unit 1320 for controlling a power supplied to the light-emitting module 1200. The interface 1310 may include a fuse for blocking overcurrents and an electromagnetic waves shielding filter for shielding an electromagnetic waves trouble signal. The power control unit 1320 may include a rectifier for converting an alternating current into a direct current when the alternating current is inputted as a power, a smoothing unit, and a constant voltage control unit for converting voltage into a voltage suitable to the light-emitting module 1200. The power supply unit 1300 may include a feedback circuit device for performing a comparison of an amount of light-emission and a predetermined amount of light-emission in each of the plurality of semiconductor light-emitting devices 1220, and a memory device for storing information, such as a desired brightness and color rendition.

The dimming system 1000 may be used as an indoor illumination device, such as a backlight unit, a lamp, and a flat lighting used as a display device of a liquid-crystal display device including an image panel, or as an outdoor illumination device, such as a sign and a notice. Alternatively, the dimming system 1000 may be used as an illumination device of various means of transportation, such as vehicles, cargos, or airplanes, as an illumination device of home appliances, such as TVs and refrigerators, or an illumination device of medical equipment.

Figure 22:
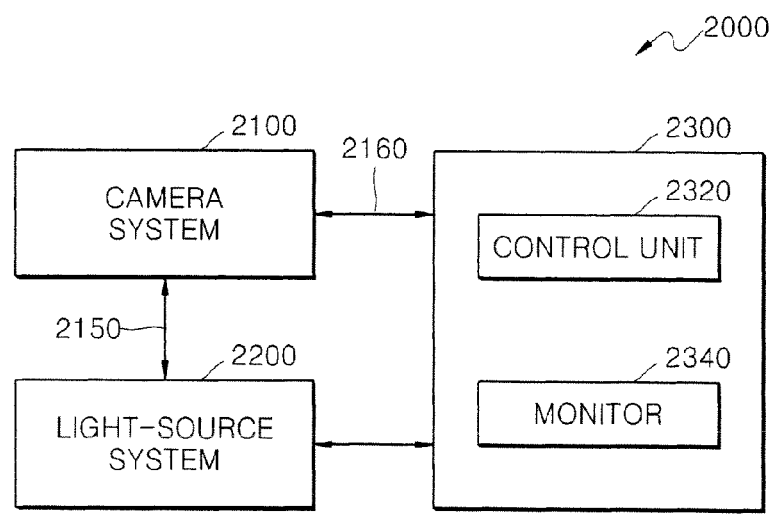
FIG. 22 is a block diagram of a light-processing system including LED packages according to exemplary embodiments of the inventive concept.

FIG. 22 is a block diagram of a light-processing system including an LED package according to exemplary embodiments of the inventive concept.

Referring to FIG. 22, the light-processing system 2000 may include a camera system 2100, a light-source system 2200, and a data process and analysis system 2300.

The camera system 2100 may be used by being arranged to directly contact a light-processing subject or by being spaced apart from and toward the light-processing subject by a predetermined distance. In some embodiments of the present inventive concept, the light-processing subject may be a biological tissue, such as skin or a treatment part. The camera system 2100 may be connected with the light-source system 2200 via a light guide 2150. The light guide 2150 may include an optical fiber light guide that is capable of light transmission, or a liquid light guide.

The light-source system 2200 may provide a light that is irradiated onto the light-processing subject via the light guide 2150. The light-source system 2200 may include at least one selected from the LED packages 100, 200, 300, 400, 500, and 600, described with reference to FIGS. 1 through 6. In some embodiments of the present inventive concept, an ultraviolet ray may be generated in the light-source system 2200 and irradiated onto the biological tissue, such as the skin or the treatment part.

The camera system 2100 may be connected with the data process and analysis system 2300 via a cable 2160. An image signal outputted from the camera system 2100 may be transmitted to the data process and analysis system 2300 via the cable 2160. The data process and analysis system 2300 may include a control unit 2320 and a monitor 2340. The data process and analysis system 2300 may process, analyze, and store the image signal transmitted from the camera system 2100.

The light-processing system 2000 illustrated in FIG. 22 may be applied to various application fields, such as skin diagnosis, medical treatment, disinfection, sterilization, cleaning, surgery articles, beauty treatment, illumination, and information detection.

While the inventive concept has been particularly shown and described with reference to exemplary embodiments thereof, it will be understood that various changes in form and details may be made therein without departing from the spirit and scope of the following claims.

What is claimed is:

1. A light-emitting diode (LED) package, comprising:
    a light-emitting structure;
    a first electrode pad and a second electrode pad, connected with the light-emitting structure;
    an insulating pattern layer in contact with a bottom surface of the light-emitting structure and abutting the first electrode pad and the second electrode pad;
    a substrate including via-holes that are in contact with a bottom surface of the insulating pattern layer and expose a portion of the first electrode pad and a portion of the second electrode pad;
    a first penetrating electrode and a second penetrating electrode that are disposed in the via-holes and are respectively connected with the first electrode pad and the second electrode pad;
    a fluorescent material layer disposed on the light-emitting structure; and
    a glass disposed on and spaced apart from the light-emitting structure with the fluorescent material layer between the glass and the light-emitting structure.

2. The LED package of claim 1, wherein the fluorescent material layer comprises an adhesive fluorescent material layer.

3. The LED package of claim 1, further comprising an adhesive material layer disposed between the fluorescent material layer and the glass.

4. The LED package of claim 3, further comprising a support layer disposed between the adhesive material layer and the insulating pattern layer to abut the light-emitting structure,
    wherein a first width of the substrate is greater than a second width of the bottom surface of the light-emitting structure.

5. The LED package of claim 4, wherein the support layer comprises an adhesive material.

6. The LED package of claim 4, wherein the second width is greater than a third width of an upper surface of the light-emitting structure.

7. The LED package of claim 1, further comprising a growth substrate of the light-emitting structure, which is interposed between the light-emitting structure and the fluorescent material layer.

8. The LED package of claim 1, wherein a fourth width of an upper surface of the glass is smaller than the first width of the substrate.

9. The LED package of claim 1, wherein the glass is tapered from a bottom surface of the glass to an upper surface of the glass.

10. A dimming system, comprising:
    a light-emitting module including the LED package of claim 1; and
    a power supply unit including an interface configured to receive power and including a power control unit configured to control power supplied to the light emitting module.

11. A light-processing system, comprising:
    a light-source system including the LED package of claim 1;
    a light guide;
    a camera system connected with the light source system via the light guide and configured to output an image signal; and
    a data process and analysis system configured to process, analyse and store the image signal outputted from the camera system.

12. A light-emitting diode (LED) package, comprising:
    a light-emitting structure;
    a first electrode pad and a second electrode pad, connected with the light-emitting structure;
    an insulating pattern layer in contact with a bottom surface of the light-emitting structure and abutting the first electrode pad and the second electrode pad;
    a substrate including via-holes that are in contact with a bottom surface of the insulating pattern layer and expose a portion of the first electrode pad and a portion of the second electrode pad;
    a first penetrating electrode and a second penetrating electrode that are disposed in the via-holes and are respectively connected with the first electrode pad and the second electrode pad;
    a fluorescent material layer disposed on the light-emitting structure and having a second width smaller than a first width of the substrate;
    a first support layer abutting the fluorescent material layer disposed on the light-emitting structure; and
    a glass disposed on and spaced apart from the light-emitting structure with the fluorescent material layer between the glass and the light-emitting structure.

13. The LED package of claim 12, wherein the first support layer comprises an adhesive material.

14. The LED package of claim 12, wherein the first support layer comprises a fluorescent material.

15. The LED package of claim 12, wherein the first support layer comprises an adhesive fluorescent material.

16. The LED package of claim 12, further comprising a second support layer abutting the light-emitting structure between an upper layer including the first support layer and the fluorescent material layer and a lower layer including the insulating pattern layer,
    wherein a third width of the bottom surface of the light-emitting structure is smaller than the first width of the substrate.

17. The LED package of claim 16, wherein the first support layer and the second support layer include an identical material.

18. A dimming system, comprising:
    a light-emitting module including the LED package of claim 12; and a power supply unit including an interface configured to receive power and including a power control unit configured to control power supplied to the light emitting module.

19. A light-processing system, comprising:

a light-source system including the LED package of claim 12;

a light guide;

a camera system connected with the light source system via the light guide and configured to output an image signal; and a data process and analysis system configured to process, analyse and store the image signal outputted from the camera system.

20. A light-emitting diode (LED) package, comprising:

a light-emitting structure including a first semiconductor layer, an active layer and a second semiconductor layer;

a first electrode pad and a second electrode pad, respectively connected with the first semiconductor layer and the second semiconductor layer of the light-emitting structure;

an insulating pattern layer in contact with a bottom surface of the light-emitting structure and disposed between the first electrode pad and the second electrode pad;

a substrate including via-holes that penetrate the substrate and expose a portion of the first electrode pad and a portion of the second electrode pad;

a first penetrating electrode and a second penetrating electrode that are disposed in the via-holes and are respectively connected with the first electrode pad and the second electrode pad, wherein a first width of the bottom surface of the light-emitting structure is greater than a second width of an upper surface of the light-emitting surface and smaller than a third width of the substrate.

* * * * *